(12) United States Patent
Jackson

(10) Patent No.: US 6,503,777 B2
(45) Date of Patent: Jan. 7, 2003

(54) DEFLECTABLE INTERCONNECT

(75) Inventor: Timothy L. Jackson, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/929,616

(22) Filed: Aug. 14, 2001

(65) Prior Publication Data

US 2002/0028534 A1 Mar. 7, 2002

Related U.S. Application Data

(62) Division of application No. 09/352,802, filed on Jul. 13, 1999, now Pat. No. 6,285,081.

(51) Int. Cl.[7] .................................................. H01L 21/44
(52) U.S. Cl. .................... 438/106; 438/108; 438/121
(58) Field of Search ................................ 438/106, 108, 438/121, 455, 456

(56) References Cited

U.S. PATENT DOCUMENTS

| | | | |
|---|---|---|---|
| 5,045,921 A | | 9/1991 | Lin et al. |
| 5,048,664 A | | 9/1991 | Jackson et al. |
| 5,199,879 A | * | 4/1993 | Kohn et al. .................... 439/63 |
| 5,216,278 A | | 6/1993 | Lin et al. |
| 5,410,124 A | | 4/1995 | Jackson |
| 5,451,721 A | | 9/1995 | Tsukada et al. |
| 5,602,422 A | | 2/1997 | Schueller et al. |
| 5,642,265 A | | 6/1997 | Bond et al. |
| 5,766,021 A | | 6/1998 | Pickles et al. |
| 5,788,271 A | | 8/1998 | Akram |
| 5,791,552 A | | 8/1998 | Werther |
| 5,812,378 A | | 9/1998 | Fjelstad et al. |
| 5,821,624 A | * | 10/1998 | Pasch .......................... 257/776 |
| 5,821,824 A | | 10/1998 | Peach |
| 5,828,128 A | | 10/1998 | Higashiguchi et al. |
| 5,835,355 A | | 11/1998 | Dordi |
| 5,849,130 A | | 12/1998 | Browne |
| 6,002,590 A | | 12/1999 | Femworth et al. |
| 6,064,576 A | | 5/2000 | Edwards et al. |
| 6,069,407 A | | 5/2000 | Hamzehdoost |
| 6,127,736 A | | 10/2000 | Aykram |
| 6,139,972 A | | 10/2000 | Trott et al. |
| 6,285,081 B1 | | 9/2001 | Jackson |

OTHER PUBLICATIONS

Copending U.S. App. Pub. No. US 2002/0027277 A1, filed on Mar. 7, 2002 (Atty. Docket No. MICRON.085C1), and pending claims.

* cited by examiner

*Primary Examiner*—Michael Sherry
*Assistant Examiner*—Scott Geyer
(74) *Attorney, Agent, or Firm*—Knobbe, Martens, Olson & Bear, LLP

(57) ABSTRACT

A package for connecting an integrated circuit to a printed circuit board. The package includes an interconnect having a deflectable cantilever and a solder bump. When the integrated circuit is affixed to the interconnect, the solder bump deflects the cantilever. When the solder bump is heated such that the solder reflows, the cantilever springs toward its non-deflected position and is at least partially absorbed by the reflowing solder.

10 Claims, 7 Drawing Sheets

DEFLECTABLE INTERCONNECT

RELATED APPLICATIONS

This application is a divisional of U.S. patent application Ser. No. 09/352,802, filed Jul. 13, 1999, now U.S. Pat. No. 6,285,081, titled, "DEFLECTABLE INTERCONNECT."

BACKGROUND OF THE INVENTION

1. Field of the Invention

The present invention relates in general to integrated circuit packages and more particularly to ball grid array (BGA) packages.

2. Background

An increasing consideration in the design and use of integrated circuits is the package in which the integrated circuit (IC) resides. As ICs become more complex, and printed circuit boards become more crowded, IC packages continually need more leads or pins while their footprints consume smaller and smaller areas. In an effort to meet these demands, developers created the ball grid array (BGA) package.

A typical BGA package includes an IC affixed to a flexible polymide tape. A very thin conductor or wire bond connects a pad on the IC to a conductive trace on the polymide tape. The conductive trace is routed to a solder ball. The solder ball is one of an array of solder balls that connect to the opposite side of the polymide tape and protrude from the bottom of the BGA package. These solder balls interconnect with an array of pads located on a substrate, such as a printed circuit board. Accordingly, the typical BGA package electrically connects each pad on an IC to a pad on a printed circuit board.

Typical BGA packages have drawbacks arising from the different coefficients of thermal expansion for the IC and the polymide tape. In general, the coefficient of thermal expansion of a material corresponds to the degree in which the material will expand when heated and contract when cooled. As the IC and the polymide tape expand and contract at different rates, the wire bond experiences stress and tension. Such stress and tension may cause the wire bond to loosen or break, thereby disconnecting the IC from the printed circuit board.

To compensate for stress and tension caused by thermal expansion, designers have developed IC packages without wire bonds. One conventional package is a "flip chip" package. A flip chip package includes an IC affixed to a polymide tape with a thick adhesive such that the pads of the IC are positioned over a layer of conductive traces. Gaps in the adhesive provide room for a plurality of solder bumps that are used to connect the pads of the IC to the conductive traces. Similar to the typical BGA package, the conductive traces are routed to downward facing solder balls, which connect with pads of a substrate, such as a printed circuit board.

Accordingly, the solder bumps of the flip chip package provide an electrical connection from the pads of the IC to the layer of conductive traces. Unfortunately, several drawbacks of these packages can prevent a good electrical connection from happening. For rid example, the solder bump and adhesive dimensions need to be matched with a great deal of accuracy. When the solder bump diameter is small as compared to the thickness of the adhesive, the solder bump cannot connect the pads of the IC to the conductive traces. On the other hand, when the solder bump diameter is large as compared to the thickness of the adhesive, then the adhesive layer cannot sufficiently affix the IC to the tape. Furthermore, when the solder bumps are heated to cause the solder to reflow, air pockets or bubbles can form. These air pockets not only make for a poor electrical connection, but also further exacerbate the relatively narrow tolerances allowed for the solder bump and adhesive.

These drawbacks can cause the loss of an electrical connection between the IC pads and the conductive traces. Such loss lowers yield rates, which in turn increases the overall cost of package manufacture.

SUMMARY OF THE INVENTION

One aspect of the invention is to provide a package having an electrical connection between an IC and an interposer. The package comprises a solder bump, a solder ball, and an interconnect having a deflectable cantilever. When the IC is affixed to the interconnect, the solder bump applies surface tension to the deflectable cantilever, thereby causing the cantilever to deflect downward. When the solder bump is heated and the solder reflows, the reflowing solder releases the surface tension on the cantilever. According to one aspect of the invention, the cantilever then springs back toward its original position, within the reflowing solder. Thus, the reflowing solder partially absorbs the cantilever.

In one embodiment, use of a deflectable cantilever advantageously provides for greater absorption of the interconnect into the solder, thereby reducing the possible effects of air pockets. In another embodiment, use of a larger diameter solder bump advantageously provides more solder, thereby also reducing the possible effects of air pockets.

Another aspect of the invention relates to a ball grid array package for an integrated circuit. The ball grid array package interconnects a plurality of solder bumps on an integrated circuit with a plurality of solder balls located on the exterior of the ball grid array package. The ball grid array package comprises at least one solder bump attached to an integrated circuit and at least one solder ball which is configured to interface with a printed circuit board. The ball grid array package further comprises an interposer with at least one pocket and at least one via, wherein the pocket is configured to receive the solder bump and wherein the via is configured to receive the solder ball.

The ball grid array package further comprises a conductive interconnect circuit which electrically interconnects the solder ball in the via with the solder bump in the pocket. The conductive interconnect circuit further comprises at least one deflectable cantilever which extends into the pocket such that the deflectable cantilever is partially absorbed by the solder bump in the pocket.

One embodiment of the invention relates to an integrated circuit package that comprises at least one solder connection attached to an integrated circuit. The integrated circuit package further comprises a substrate with an opening which is configured to receive the solder connection attached to the integrated circuit. The integrated circuit package also comprises a resilient cantilever which extends into the opening such that the resilient cantilever applies pressure to the solder connection during reflow.

Another embodiment of the invention relates to an apparatus that comprises an interconnect layer with a first opening. The apparatus further comprises a conductor layered above the interconnect layer. The conductor comprising a deformable portion that extends into the first opening, wherein the deformable portion has resiliency that urges the deformable portion into a solder connection.

An additional embodiment relates to an integrated circuit package that comprises a first solder connection in communication with an integrated circuit. The integrated circuit package further comprises an interconnect layer having a first opening. The integrated circuit package also comprises a conductor layered above the interconnect layer. The conductor comprising a deflectable portion that extends into the first opening, wherein the deflectable portion has resiliency that urges the deflectable portion into the solder connection during reflow.

One embodiment of the invention relates to an apparatus comprising a substrate with an opening. The apparatus further comprising a conductive layer above the interconnect layer. The conductive layer comprising at least two malleable portions which extend into the opening. In another embodiment a package comprises an integrated circuit having a pad and a solder connection in communication with the pad. The package further comprises a partially deflected first conductor and a partially deflected second conductor. The partially deflected first and second conductors each at least partially absorbed by the solder connection.

In an additional embodiment, an apparatus comprises a substrate with an opening. The apparatus further comprises a conductive layer above the interconnect layer. The conductive layer comprising at least two flaps which extend into the opening. Yet another embodiment relates to a package that comprises an integrated circuit having a pad and a solder bump in communication with the pad. The package further comprises a deflectable conductor having partially deflected multiple flaps. The partially deflected multiple flaps are at least partially absorbed by the solder bump, wherein the absorption of the partially deflected multiple flaps is caused by the partially deflected multiple flaps moving from a deflected position toward a non-deflected position when the solder bump reflows.

One embodiment of the invention relates to a package for an integrated circuit that comprises an adhesive having a thickness and a solder bump having a diameter greater than the adhesive thickness. The package further comprises a conductive trace having a deflectable cantilever, wherein the deflectable cantilever deflects into a pocket when the adhesive layer affixes the integrated circuit to the conductive trace. The cantilever also springs toward its original position when the solder bump reflows. The package also comprises a solder ball and a tape attached between the conductive trace and the solder ball.

Another embodiment of the invention relates to a method for forming a package for an integrated circuit that comprises attaching a solder bump to an integrated circuit and forming a pocket in an interposer. The method further comprises tracing an interconnect over the interposer such that a deflectable portion of the interconnect extends over a portion of the pocket. The method also comprises affixing the integrated circuit to the interposer such that the solder bump deflects the deflectable portion of the interconnect into the pocket.

An additional embodiment relates to a method for forming a package for an integrated circuit. The method comprises heating a solder bump to at least partially melt the solder bump. The method further comprises allowing a deflectable portion of an interconnect to spring toward a non-deflected position of the deflectable portion. The method also comprises partially absorbing the deflectable portion into the solder of the solder bump.

Yet another embodiment of the invention relates to a method for forming a package for an integrated circuit. The method comprises forming an interconnect with at least two resilient conductors. The method further comprises deflecting the two resilient conductors with solder and heating the solder to at least partially melt the solder. The method also comprises allowing the two resilient conductors to spring into at least a portion of the solder.

One embodiment of the invention relates to a method for forming a package for an integrated circuit. The method comprises forming an interconnect with at least one deflectable flap and deflecting the flap with solder. The method further comprises heating the solder to at least partially melt the solder and allowing the flap to be absorbed by at least a portion of the solder bump.

Another embodiment of the invention relates to a method for forming an electrical connection between solder and a conductive material. The method comprises using solder to apply a surface tension on a deflectable portion of a conductive material, thereby deflecting the deflectable portion. The method further comprises heating the solder beyond a melting point, thereby substantially reducing the surface tension on the deflectable portion. The method also comprises partially absorbing the deflectable portion into the solder as the deflectable portion springs back toward its approximate original position.

An additional embodiment of the invention relates to a method for forming an electrical connection between solder and a conductive material. The method comprises using solder to deflect a cantilever and heating the solder beyond a melting point. The method further comprises partially absorbing the cantilever into the solder as the cantilever springs back toward a non-deflected position.

Yet another embodiment of the invention relates to a method for forming an electrical connection between solder and a conductive material. The method comprises using solder to deflect a cantilever from a first position to a second position and heating the solder beyond a melting point. The method further comprises at least partially absorbing the cantilever into the solder such that the cantilever moves from a second position to a third position.

One embodiment of the invention relates to a device that comprises means for affixing an integrated circuit to a conductive layer. The device further comprises means for deflecting the conductive layer and then partially absorbing the conductive layer, thereby electrically connecting the integrated circuit to the conductive layer.

For purposes of summarizing the invention, certain aspects, advantages and novel features of the invention have been described herein above. Of course, it is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein. Furthermore, Other aspects and advantages of the invention will be apparent from the detailed description, the accompanying drawings and the appended claims.

BRIEF DESCRIPTION OF THE DRAWINGS

The present invention is described in more detail below in connection with the attached drawings, which are meant to illustrate and not to limit the invention, and in which.

DETAILED DESCRIPTION OF THE PREFERRED EMBODIMENT

While illustrated in the context of forming an electrical connection between an IC and an interposer, the skilled artisan will find application for the deflectable cantilever disclosed herein in a wide variety of contexts. For example, the disclosed deflectable cantilever has utility in providing an electrical connection when solder is used as a conductor, such as within a BGA package.

Figure 1A:
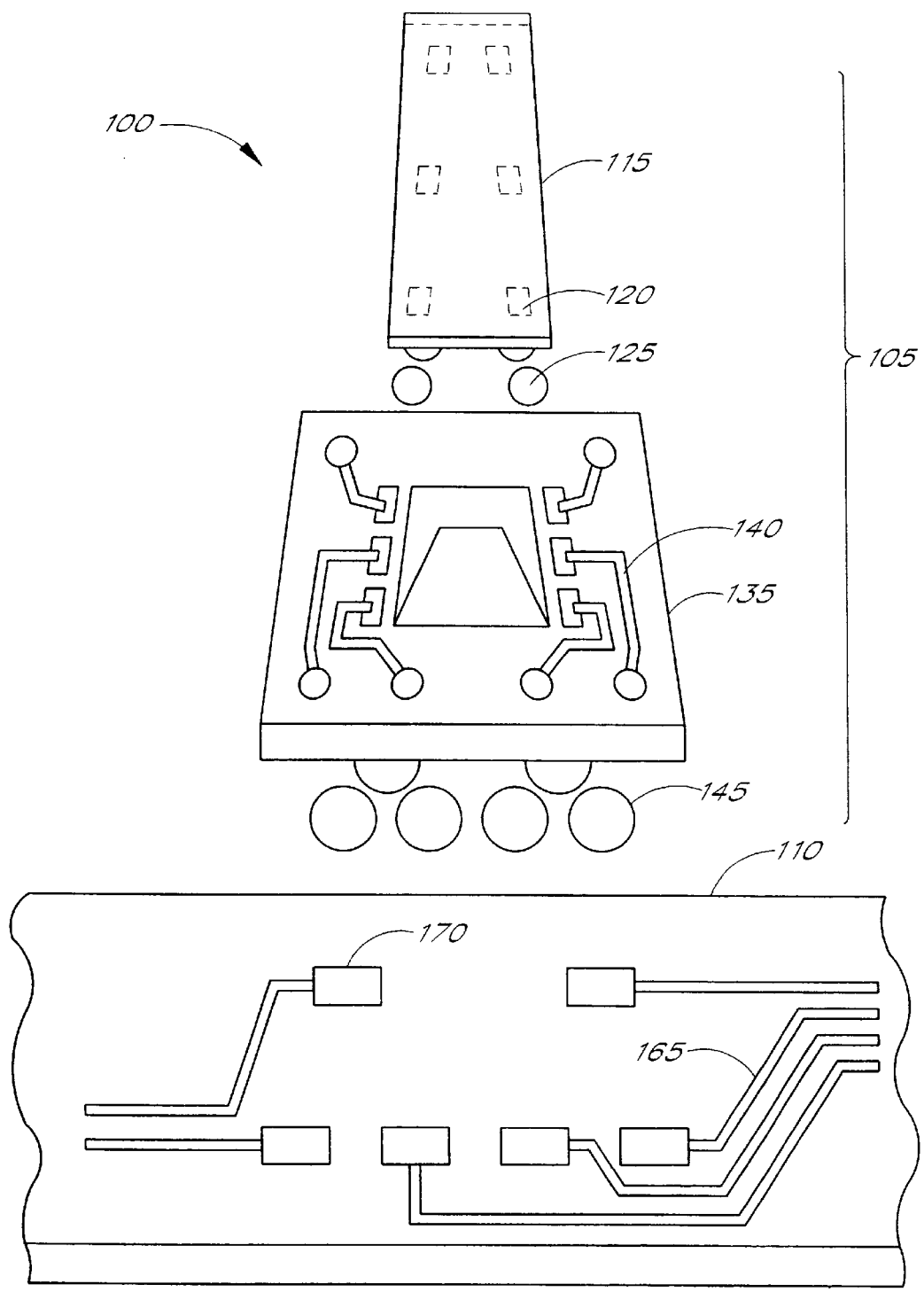
FIG. 1A is an exploded view of an electrical device, in accordance with one embodiment of the invention.
Figure 1B:
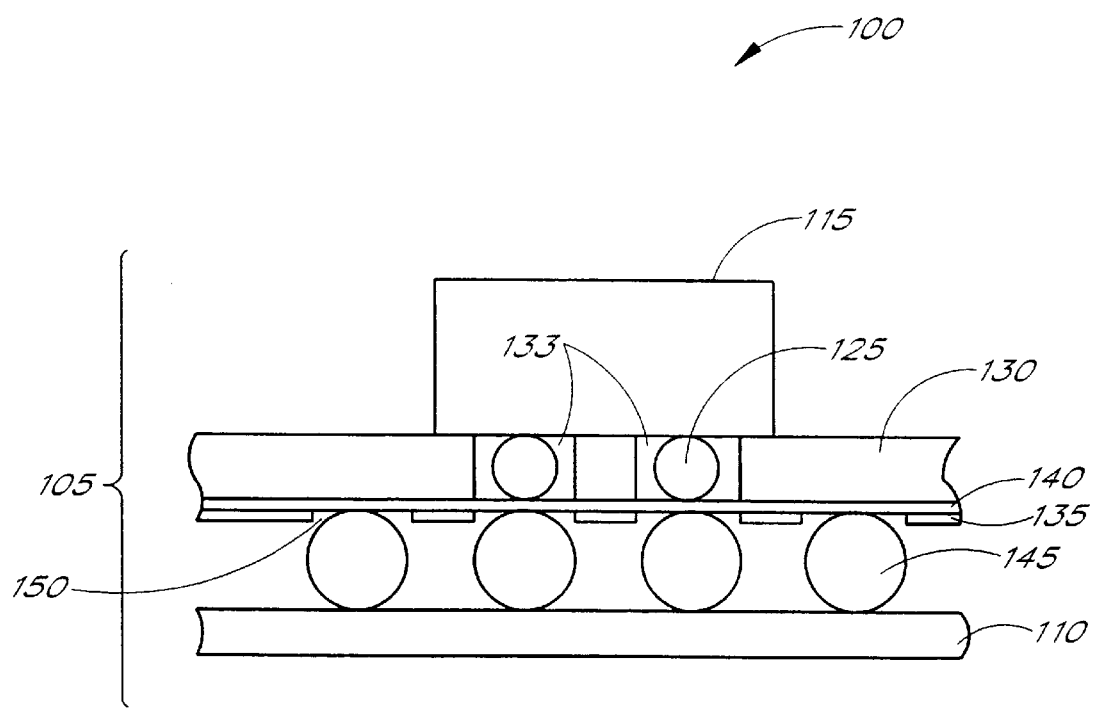
FIG. 1B is a cross-sectional view of the electrical device of FIG. 1A.

FIGS. 1A and 1B illustrate an electrical device 100, including a package 105, and a substrate 110. FIG. 1A illustrates an exploded view of the electrical device 100, while FIG. 1B illustrates a cross sectional view of the same. The electrical device 100 finds use in a wide variety of applications. For example, the package 105 can be used in any electronic circuit needing the attachment of an integrated circuit or the die 115 to the substrate 110, such as the attachment of a microprocessor to a printed circuit board.

In the illustrated embodiment of FIGS. 1A and 1B, the package 105 comprises the die 115, pads 120, solder bumps 125, an adhesive 130, an interposer 135 having interconnects 140, and solder balls 145. The die 115 will be understood by one of ordinary skill in the art to be any integrated circuit. For example, the die 115 can be from a wide range of integrated circuit products, such as: microprocessors, co-processors, digital signal processors, graphics processors, microcontrollers, memory devices, reprogrammable devices, programmable logic devices, and logic arrays. In one embodiment, the die 115 comprises a memory device.

The pads 120 are shown in broken lines to indicate that they are on the reverse side of the die 115. In one embodiment, the pads 120 electrically connect the die 115 to a variety of other devices, signals, or other "off chip" systems. It will be understood by one of skill in the art of semiconductor package design that throughout the disclosure, the number of pads 120, solder bumps 125, interposer 135, interconnects 140, solder balls 145, etc. are illustrated for clarity with only a few examples. In reality, there may be many pads 120 on the die 115. For example, commercially available memory devices from Micron Technology, Inc. include a 60-pin DRAM and a 100-pin SRAM, having 60 and 100 pads, respectively.

The pads 120 are electrically connected to the solder bumps 125. Such connection can be by commercially available processes, such as those offered by Flip Chip Tech. In one embodiment, the solder bumps 125 are small approximate spheres of solder. However, it will be understood that a wide variety of shapes could be used. For example, the solder bumps 125 could be in the shape of a pin or a cylinder or be any type of solder connection.

As illustrated in FIG. 1B, the package 105 includes the adhesive 130 for affixing the die 115 to the interposer 135 and the interconnects 140. In one embodiment, the adhesive 130 includes a number of adhesive gaps or adhesive pockets 133, which make room for the solder bumps 125. The adhesive 130 should also be strong enough to properly affix the die 115 to the interposer 135 and the interconnects 140, such that the solder bumps 125 deflect a portion of the interconnects 140, as discussed in more detail below. In one embodiment, the adhesive 130 comprises a thermal plastic polymer, however, it will be understood that the adhesive 130 can be a variety of products. For example, the adhesive 130 can comprise any thermal set, thermal plastic, or any adhesive. Such products are commercially available from various manufactures such as: Ablestik, Sumioxy, Dow Coming, and Hitachi.

As illustrated in FIG. 1A, the interconnects 140 are conductive paths or traces from the physical locations of the solder bumps 125 to the physical locations of the solder balls 145. In one embodiment, the interconnects 140 are a resilient, yet malleable conductive material such that they provide spring or memory as well as conductivity. For example, when a surface tension is placed on the interconnects 140, they should deflect in a direction corresponding to the surface tension. When the surface tension is removed, the interconnects 140 "spring" back in the direction of their original position. A wide variety of conductive materials exhibit such properties. For example, in one embodiment, the interconnects 140 include gold plated copper. However, it is understood that other conductive materials and combinations are also suitable, such as, but not limited to, copper, gold, aluminum, and various alloys.

The interconnects 140 can also comprise a wide variety of trace patterns, in a wide variety of sizes and layers. For example, the interconnects 140 trace from the physical positions of the solder bumps 125 to the physical positions of the solder balls 145 along a single layer. However, it is understood that multiple layers of the interconnects 140 could trace through multiple layers of the interposer 135 in order to provide sufficient physical space for the amount of the interconnects 140 needed to correspond to the amount of pads 120 on the die 115.

In one embodiment, the interposer 135 provides on one side a surface upon which the interconnects 140 are traced, and on the other side a connecting point for the solder balls 145. In one embodiment, the interposer 135 is a flexible "tape" substrate comprising insulating material, such as polymide tape. It is understood that other substrates could also be used, such as thermoplastic, thermoplast, epoxy, flex circuits, printed circuit board materials, or fiber materials. Polymide tape and analogous materials are commercially available from Shinko, Sumitomo, Compass, 3M, Casio, Packard-Hughes, Hitachi Cable, Cicorel, Shindo, Mitsui MS, and Rite Flex.

Further, the interposer 135 includes the vias 150 for attaching the solder balls 145 to the interconnects 140. In one embodiment, the vias 150 correspond to a pre-defined pattern of the solder balls 145 for the package 105. Using pre-defined patterns for the solder balls 145 allows the output mechanisms, e.g., the solder balls 145, to remain constant over changing patterns of the pads 120 corresponding to changing the die 115. In such packages, the interposer 135 is customized on the side facing the interconnects 140. For example, the interposer 135 would be customized by the tracing of the interconnects 140 from the pre-defined pattern of the vias 150 to corresponding physical locations of the pads 120 on the die 115.

However, it will be understood that the pattern of the solder balls 145 need not be pre-defined. Rather, the interposer 135 could have a pre-defined pattern for the physical location of the pads 120, and use the interconnects 140 to trace to the vias 150 connected to a customized pattern of the solder balls 145. Alternatively, the interconnects 140 could connect customized patterns for both the pads 120 and the solder balls 145.

Furthermore, in one embodiment, the interposer 135 includes deflection pockets 155. The deflection pockets 155 exist on the interconnect-facing side of the interposer 135. Deflectable portions, or cantilevers 160, of the interconnects 140, extend above the deflection pockets 155 such that when surface tension is applied to the tops of the cantilevers 160, it causes the cantilevers 160 to deflect downward into the deflection pockets 155.

In one embodiment, the package 105 is mounted on the substrate 110, where the substrate 110 comprises a printed circuit board. However, it will be understood that the substrate 110 could comprise a wide variety of materials for a wide variety of applications. For example, in one embodiment, the substrate 110 is a printed circuit board. One of skill in the art, however, will recognize that the substrate can include a wide variety of materials including, but not limited to BT and FR4.

The substrate 110 includes conductive traces 165 electrically connected to substrate pads 170. The substrate pads 170 are configured to correspond to, or match with, the physical location of the solder balls 145. The conductive traces 165 trace an electrical connection from the substrate pads 170 to any number of "off chip" systems or signals.

Figure 2:
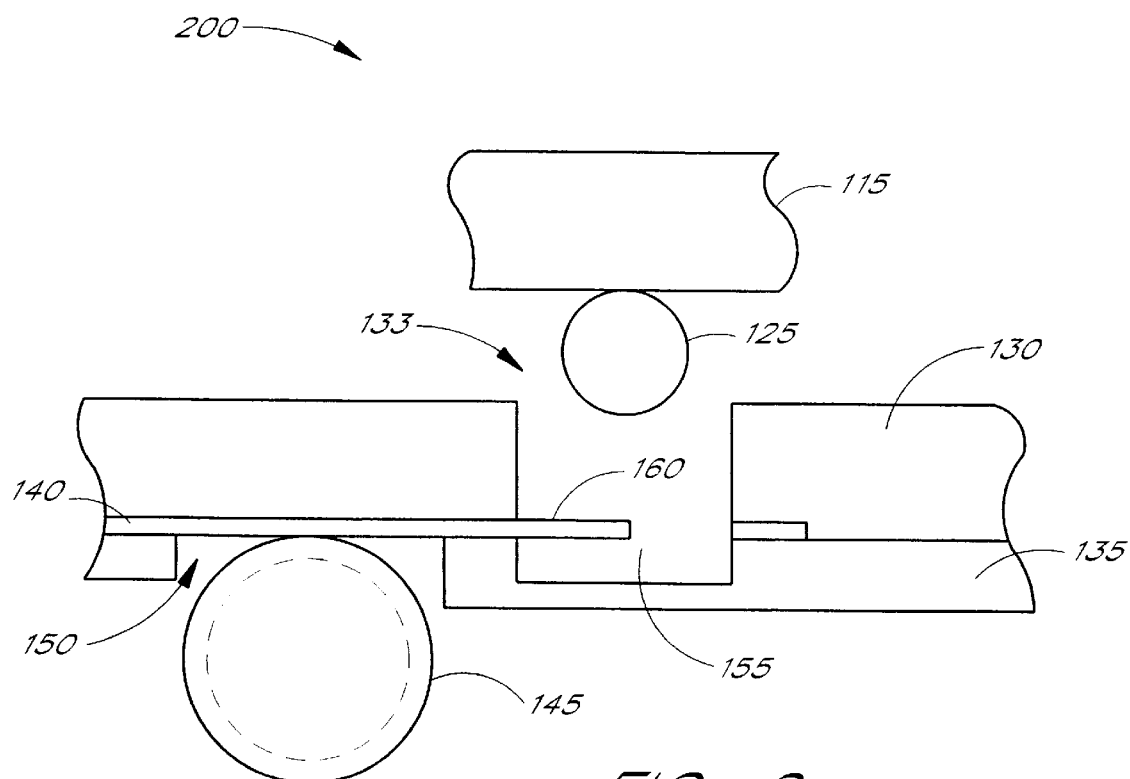
FIG. 2 is a cross-sectional view of a package having a deflectable cantilever, prior to attachment of an IC, according to another embodiment.
Figure 3:
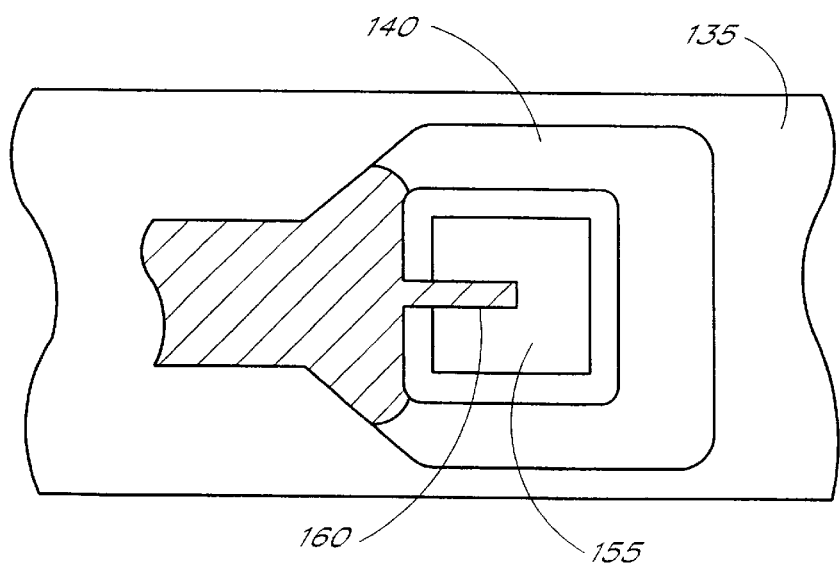
FIG. 3 is a top view of the deflectable cantilever of FIG. 2.
Figure 4:
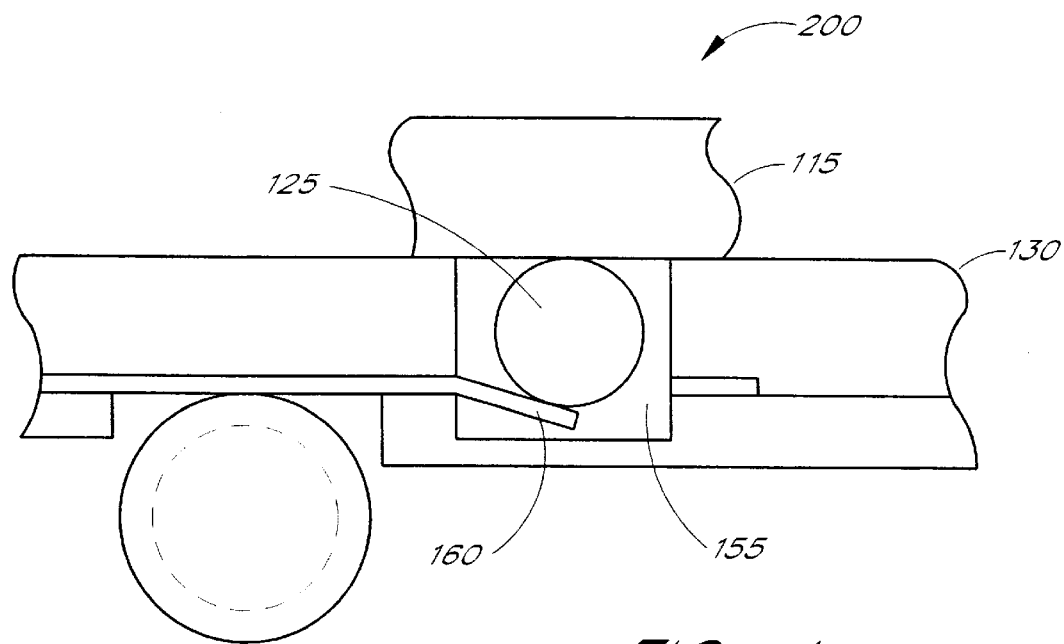
FIG. 4 is a cross-sectional view of the package of FIG. 2, after attachment of the IC.
Figure 5:
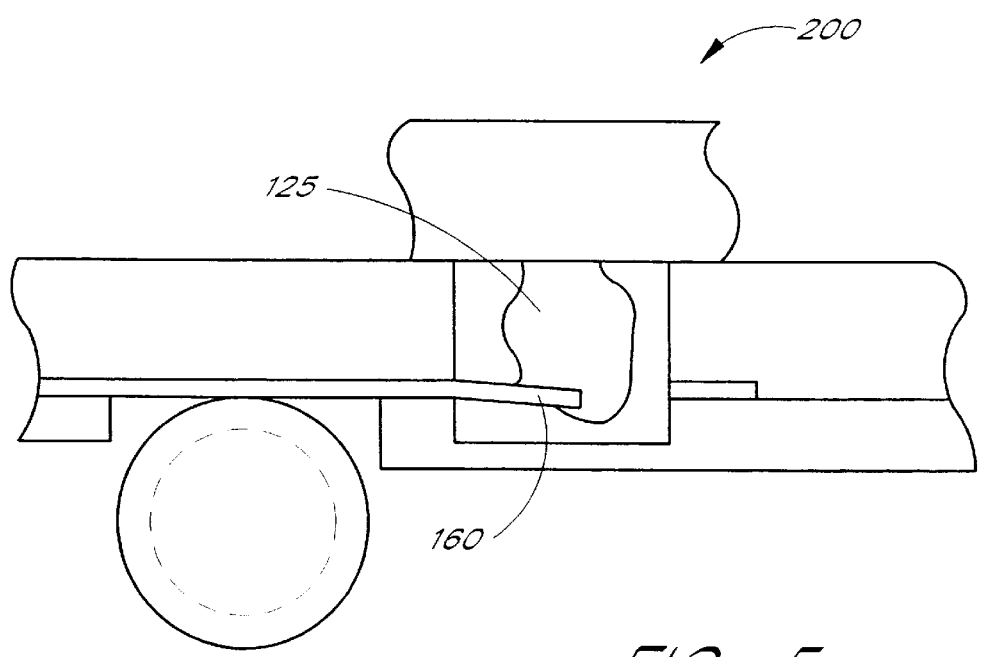
FIG. 5 is a cross-sectional view of the package of FIG. 2, after reflow of the solder bump.

FIGS. 2–5 illustrate a package 200, according to another embodiment of the invention. In particular, FIGS. 2 and 4 illustrate a process of combining elements of the package 200 in order to deflect the cantilever 160 into a deflection pocket 155, while FIG. 3 illustrates a top view of the cantilever 160. FIG. 5 illustrates the package 200 after reflow of the solder in the solder bump 125. It will be understood that for clarity, FIGS. 2–5 illustrate only one electrical connection made from the die 115, through the solder bump 125 and interconnect 140, to the solder ball 145. As mentioned above, the die 115 may have many electrical connections through many solder bumps 125 and interconnects 140, to many solder balls 145.

FIG. 2 illustrates a cross-sectional view of the package 200 before attachment of the die 115. As shown in FIG. 2, the solder bump 125 is attached to the die 115. In addition, the interposer 135, the interconnect 160 and the adhesive 130 are configured to receive the solder bump 125 and the die 115. As discussed above, the interposer 135 comprises the via 150 and the deflection pocket 155. In FIG. 2, the solder ball 145 has not yet been attached to the via 150. However, it will be understood that the solder ball 145 could be attached and therefore, the solder ball 145 is shown in broken lines in FIGS. 2, 4–6, and 8–9.

In one embodiment, the interconnect 140 is constructed by depositing gold plated copper on to the interposer 135. Conventional etching techniques are then used to create a desired pattern for the interconnect 140. In certain embodiments, the interconnect 140 is traced on the die-facing side of the interconnect 140. As discussed in further detail below, the interconnect 140 can include a cantilever 160. The skilled artisan will recognize that the interconnect 140 can be a wide range of conductors, conductive traces or the like. Furthermore, the cantilever 160 can in certain embodiments include deflectable portions, resilient portions, deformable portions, or malleable portions of the interconnect 140.

The adhesive 130 attaches the interposer 135 and the interconnect 140 to the die 115. In one embodiment, the adhesive 130 is selected such that it can withstand a temperature of at least about 150° C., for example, Sumioxy LOC Tape, manufactured by Occidental Chemical Corporation.

The adhesive layer 130 comprises at least one adhesive pocket 133. In one embodiment, the adhesive pocket 133 extends through the adhesive layer 130 and partially into the interposer 135. In other embodiments, the adhesive pockets 133 are holes that extend through the adhesive layer 130 and the interposer 135. The adhesive pocket 133 is dimensioned to receive the solder bump 125. In one embodiment, the adhesive pocket 133 is constructed by selectively applying adhesive to the interconnect 140 and the interposer 135 using known techniques. In other embodiments, the adhesive pocket 133 is constructed by screen printing, drilling or punching the adhesive layer 130 or interposer 135.

FIG. 3 illustrates a top view of the interposer 135 and the interconnect 140. In FIG. 3, the interposer 135 includes the deflection pocket 155 surrounded by the interconnect 140. In one embodiment, the deflection pocket 155 is approximately square in shape and does not extend entirely through the interposer 135. However, it will be understood that a wide variety of shapes could be used to form the deflection pocket 155, for example, approximately circular, oval, or polygonal shapes could be used. Furthermore, it will be understood that a wide variety of shapes of the interconnect 140 could be used to surround the deflection pocket 155. For example, the shapes of the interconnect 140 could either correspond to, or be different from, the wide variety of shapes of the deflection pocket 155. For example, the deflection pocket 155 could be polygonal in shape and be surrounded by the interconnect 140 in a circular fashion.

Also, the deflection pocket 155 could extend entirely through the interposer 135 thereby creating another hole or via in the interposer 135. While such a punched-through deflection pocket 155 is typically easier to manufacture, it can expose the interior of the package 200 to environmental conditions after the die 115 and the solder ball 125 are attached.

FIG. 3 also illustrates the cantilever 160 extending over the deflection pocket 155. In one embodiment, the cantilever 160 extends approximately half the distance across the deflection pocket 155. However, it is understood that one skilled in the art could manipulate the flexibility and spring constant of the cantilever 160 by adjusting the width and length thereof. The pattern of the interconnect 140 is shown deposited on a portion of the interposer 135 and over the defection pocket 155. It will be understood by one of skill in the art that the pattern of the interconnect 140 can be adapted for a variety of patterns and situations.

FIG. 4 illustrates a cross-sectional view of the package 200, after the die 115 and the solder bump 125 are affixed to the adhesive 130. In one embodiment, the diameter of the solder bump 125 is larger than the thickness of the adhesive 130, and therefore, the solder bump 125 applies a surface tension to the cantilever 160. The surface tension deflects the cantilever 160 downward into the deflection pocket 155. In one embodiment, the resilient deflected cantilever 160 applies a pressure on the solder bump 125 that is directed towards the surface of the solder bump 125.

FIG. 5 illustrates a cross-sectional view of the package 200 after reflow of the solder in the solder bump 125. When the solder in the solder bump 125 reflows, it applies less surface tension to the cantilever 160, allowing the cantilever 160 to spring back in the direction of the original position of the cantilever 160. As the cantilever 160 returns, it is at least partially absorbed by the reflowing solder. Thus, in one embodiment, the cantilever 160 applies an inwardly directed pressure to the solder bump 125 the urges the cantilever 160 into the solder bump 125.

It will be understood that the die 115, the solder bump 125, the adhesive 130, the interposer 135, the interconnect 140, and the solder ball 145, could have a variety of sizes and thicknesses. As mentioned, the die 115 can be from a wide range of integrated circuit products. For this reason, the type of integrated circuit product will dictate the thickness of the die 115. In one embodiment, the die 115 is a dynamic memory device with a thickness of approximately 280 microns. Also, in one embodiment, the thickness of the interconnect 140 and the cantilever 160 is approximately 15 microns, the thickness of the interposer 135 is approximately 48 microns, and the diameter of the solder ball 145 is approximately 400 microns.

One advantage of the cantilever 160 is that the diameter of the solder bump 125 and the thickness of the adhesive 130 can vary over wider ranges. For example, when the diameter of the solder bump 125 is larger than the thickness of the adhesive 130, the cantilever 160 is deflected into the deflection pocket 155. Thus, in order to create an electrical connection, the diameter of the solder bump 125 in the package 200 can be as thick or thicker than the adhesive 130. In one embodiment, the diameter of the solder bump 125 is approximately 200 microns and the thickness of the adhesive 130 is approximately 176 microns.

The embodiment of FIGS. 2–5 thus provides the package 200 that has electrical connections from the pads 120 on the die 115, through the solder bumps 125 and the interconnects 140, to the solder balls 145. The solder bumps 125 deflect the cantilevers 160 when the die 115 is affixed to the adhesive 130. During reflow, the cantilevers 160 spring back toward their original position and are thereby partially absorbed by the solder bump 125. Deflection allows for relaxed tolerance requirements between the diameter of the solder bump 125 and the thickness of the adhesive 130. Partial absorption allows for formation of an electrical connection. These characteristics improve yield rates and thereby decrease the cost of package manufacture.

Figure 6:
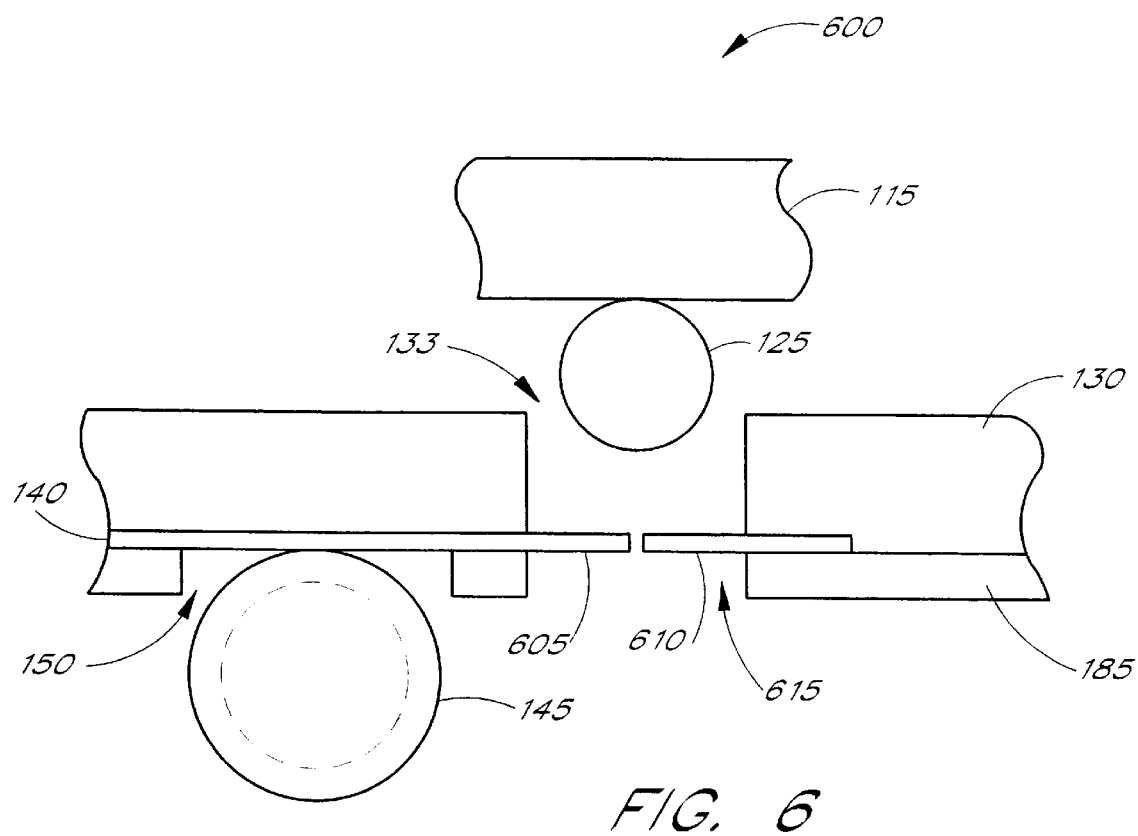
FIG. 6 is a cross-sectional view of a package having dual deflectable cantilevers, prior to attachment of an IC, according to yet another embodiment.
Figure 7:
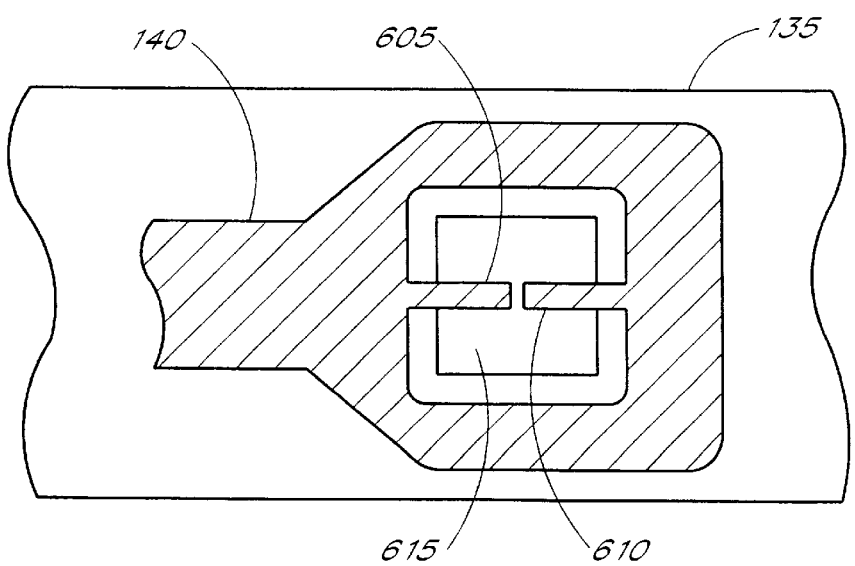
FIG. 7 is a top view of the dual deflectable cantilevers of FIG. 6.
Figure 8:
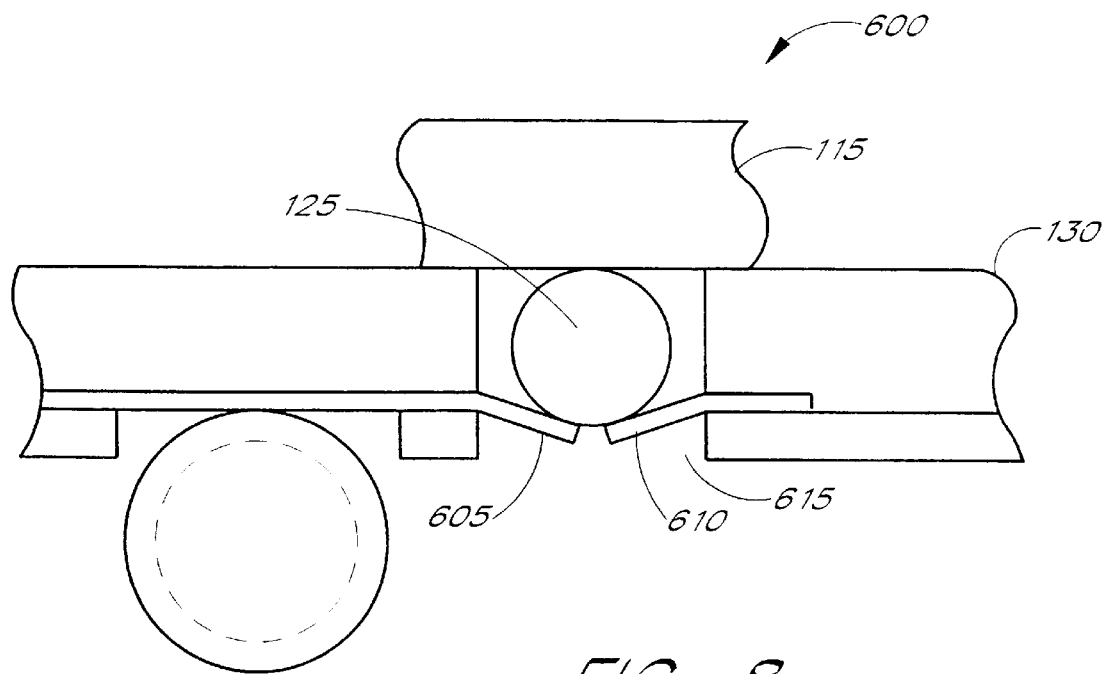
FIG. 8 is a cross-sectional view of the package of FIG. 6, after attachment of the IC.
Figure 9:
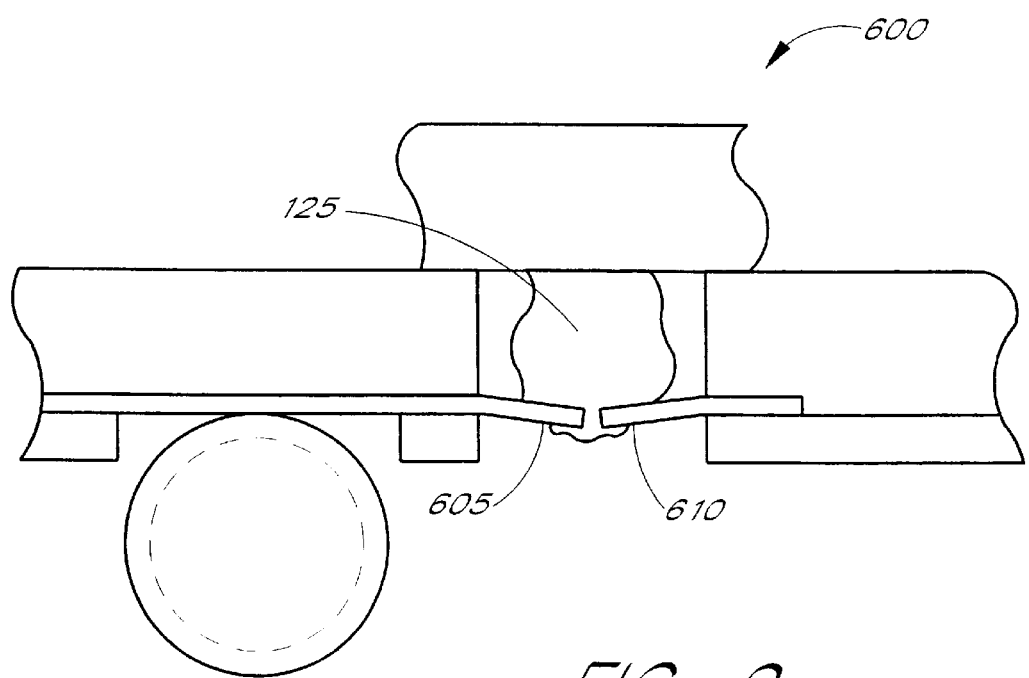
FIG. 9 is a cross-sectional view of the package of FIG. 6, after reflow of the solder bump.

FIGS. 6–9 illustrate a package 600 according to yet another embodiment of the invention. In particular, FIGS. 6 and 8 illustrate a process of combining elements of the package 600 in order to deflect dual cantilevers 605 and 610 into a deflection pocket 615, while FIG. 7 illustrates a top view of the dual cantilevers 605 and 610. FIG. 9 illustrates the package 600 after reflow of the solder in the solder bump 125. It will be understood that for clarity, FIGS. 6–9 illustrate only one electrical connection made from the die 115, through the solder bump 125 and interconnect 140, to the solder ball 145. As mentioned above, the die 115 may have many electrical connections through many solder bumps 125 and interconnects 140, to many solder balls 145.

Accordingly, FIG. 6 illustrates a cross-sectional view of the package 600 before attachment of the die 115. As shown in FIG. 6, the solder bump 125 is attached to the die 115. Furthermore, the interposer 135 includes the interconnect 140 traced on at least the die-facing side of the interposer 135. In one embodiment, the interconnect 140 is deposited on the interposer 135. Typical etching techniques are used to create a desired pattern for the interconnect 140.

The interposer 135 also includes the via 150 and the deflection pocket 615. In one embodiment, the solder ball 145 has not yet been attached to the via 150. The adhesive 130 is then added in order to cover both the interposer 135 and the interconnect 140. The adhesive pockets 133 are added, punched, drilled and screen printed. In certain embodiments, the pocket 615 and the via 150 comprise openings formed in the interposer 135.

FIG. 7 illustrates a top view of the interposer 135 and the interconnect 140. The interposer 135 includes the deflection pocket 615 surrounded by the interconnect 140. In one embodiment, the deflection pocket 615 is approximately square in shape and does not extend entirely through the interposer 135. However, it will be understood that a wide variety of shapes could be used to form the deflection pocket 615. Furthermore, it will be understood that a wide variety of shapes of the interconnect 140 could be used to surround the deflection pocket 615. For example, the deflection pocket 615 could be polygonal in shape and be surrounded by the interconnect 140 in a circular fashion.

FIG. 7 also illustrates the deflection pocket 615 as an alternative to the deflection pocket 155 of FIGS. 2–5. The deflection pocket 615 extends through the interposer 135. It will be understood that a skilled artisan would recognize that the deflection pocket 615 could be used with the embodiment of FIGS. 2–5, and likewise, the deflection pocket 155 could be adapted for use in FIG. 6.

FIG. 7 also illustrates the dual cantilevers 605 and 610 extending over the deflection pocket 615 from opposite sides. Each of the dual cantilevers 605 and 610 is similar in composition and material considerations as those mentioned in reference to the cantilever 160. In one embodiment, each of the dual cantilevers 605 and 610 has a length which is approximately half the diameter or width of the deflection pocket 615. In other embodiments, the first cantilever 605 may be approximately a third of the width of the deflection pocket 615 while the second cantilever 610 may be approximately two-thirds the width of the deflection pocket 615. In yet other embodiments, the dual cantilevers 605 and 610 may each be less than approximately half the width of the deflection pocket 615.

It will be understood that a skilled artisan would recognize a wide range of lengths and designs for the dual cantilevers 605 and 610. For example, directly opposite cantilevers may have a lower bound on their lengths being dictated only by the desire for some deflection therein. Moreover, the dual cantilevers 605 and 610 may be of different lengths in order to exhibit different deflection distances. Thereby, the dual cantilever 605 and 610 would be absorbed into different areas of the solder bump 125.

Also, the dual cantilevers 605 and 610 could have lengths longer than half the a diameter, or half the width, of the deflection pocket 615 by being offset from direct opposition of each other. In addition to the embodiments mentioned above, it is understood that a skilled artisan may use other designs for the dual cantilevers 605 and 610 directed to needs recognizable to such an artisan. Also, it is understood that one skilled in the art could manipulate the flexibility and spring constant of each of the dual cantilevers 605 and 610 by adjusting the widths and lengths thereof.

FIG. 8 illustrates a cross-sectional view of the package 600, after the die 115 and the solder bump 125 are affixed to the adhesive 130. In one embodiment, the diameter of the solder bump 125 is larger than the thickness of the adhesive 130, and therefore, the solder bump 125 applies a surface tension to the dual cantilevers 605 and 610. The surface tension deflects the dual cantilevers 605 and 610 downward into the deflection pocket 615.

FIG. 9 illustrates a cross-sectional view of the package 600 after reflow of the solder in the solder bump 125. When the solder in the solder bump 125 reflows, it applies less surface tension to the dual cantilevers 605 and 610, allowing each of the dual cantilevers 605 and 610 to spring back in the direction of their original position. As the dual cantilevers 605 and 610 return, they are at least partially absorbed by the reflowing solder. Partial absorption creates an electrical connection in spite of possible air pockets or bubbles.

Similar to FIGS. 2–5, use of the dual cantilevers 605 and 610 in the package 600 allows the diameter of the solder bump 125 and the thickness of the adhesive 130 to have a more relaxed relationship. For example, when the diameter of the solder bump 125 is larger than the thickness of the adhesive 130, the dual cantilevers 605 and 610 are deflected into the deflection pocket 615. Thus, in order to create an electrical connection, the diameter of the solder bump 125 in the package 600 need only be as thick as the adhesive 130. On the other hand, the diameter of the solder bump 125 may be as large as the maximum deflection of the dual cantilevers 605 and 605. In one embodiment, the diameter of the solder bump 125 is approximately 200 microns and the thickness of the adhesive 130 is approximately 176 microns.

The embodiment of FIGS. 6–9 thus provides the package 600 that has electrical connections from the pads 120 on the die 115, through the solder bumps 125 and the interconnects 140, to the solder balls 145. The solder bumps 125 deflect the dual cantilevers 605 and 610 when the die 115 is affixed to the adhesive 130. During reflow, the dual cantilevers 605 and 610 spring back toward their approximate original position and are thereby partially absorbed by the solder bumps 125. Deflection allows for relaxed tolerance requirements between the diameter of the solder bumps 125 and the thickness of the adhesive 130. Partial absorption allows for formation of an electrical connection. These characteristics improve yield rates and thereby decrease the cost of package manufacture.

Figure 10:
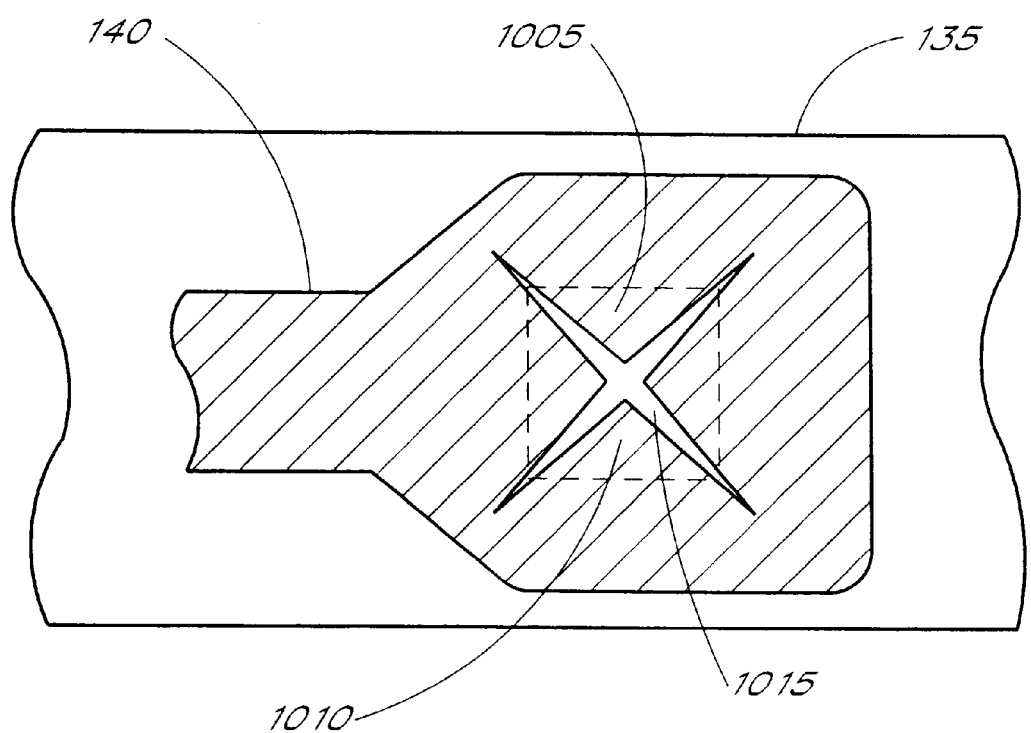
FIG. 10 is a top view of a multi-flap cantilever, according to yet another embodiment.

FIG. 10 illustrates a top view of yet another embodiment of the invention. Similar to FIGS. 3 and 7, FIG. 10 includes the interposer 135 having a deflection pocket 1010 (shown in broken lines) surrounded by the interconnect 140. As with the deflection pocket 155, it will be understood that the deflection pocket 1010 could be many shapes and the interconnect 140 may or may not correspond to such shapes. Furthermore, the deflection pocket 1010 could extend entirely through the interposer 135. However, in one embodiment, the deflection pocket 1010 is approximately square and extends only partially through the interposer 135.

As further illustrated by FIG. 10, the interconnect 140 includes a series of flaps 1005 extending over and partially covering the deflection pocket 1010. The flaps 1005 are made by depositing the interconnect 140 over the deflection pocket 1010 and then etching openings 1015 therein. The deposition and etching are done by typical methods known to one of ordinary skill in the art of package design. The openings 1015 define the shape of the flaps 1005 and provide the ability of the flaps 1005 to deflect downward into the deflection pocket 1010. It will be understood that the flaps 1005 could be a wide variety of shapes and sizes. However, in one embodiment, the flaps 1005 comprise four triangular-shaped flaps 1005, with each of the flaps 1005 having one vertice in the approximate center of the deflection pocket 1010.

Although the foregoing invention has been described in terms of certain preferred embodiments, other embodiments will be apparent to those of ordinary skill in the art. For example, a wide variety of shapes and sizes of both the pockets and corresponding deflectable interconnect portions may be combined to provide electrical connections within a package. Additionally, other combinations, omissions, substitutions and modifications will be apparent to the skilled artisan, in view of the disclosure herein. Accordingly, the present invention is not intended to be limited by the recitation of the preferred embodiments, but is instead to be defined by reference to the appended claims.

What is claimed is:

1. A method for forming a package for an integrated circuit, the method-comprising:

forming a first pocket in a first side of an interposer;

forming a second pocket in a second side of the interposer;

tracing an interconnect in the interposer such that a deflectable portion of the interconnect extends over a portion of the first pocket forming a plurality of cantilevers, wherein at least one cantilever is longer than another cantilever;

affixing an integrated circuit to the first side of the interposer such that a solder bump attached to the integrated circuit deflects the cantilevers into the first pocket;

at least partially absorbing the cantilevers into the solder bump; and affixing a solder ball at least partially within the second pocket, wherein the solder ball electrically connects to the interconnect.

2. A method for forming a package for an integrated circuit, the method comprising:

forming a first pocket in a first side of an interposer;

forming a second pocket in a second side of the interposer;

tracing an interconnect in the interposer such that a deflectable portion of the interconnect extends over a portion of the first pocket forming a plurality of cantilevers, wherein at least one cantilever is larger than another cantilever;

affixing an integrated circuit to the first side of the interposer such that a solder bump attached to the integrated circuit deflects the cantilevers into the first pocket;

at least partially absorbing the cantilevers into the solder bump; and affixing a solder ball at least partially within the second pocket, wherein the solder ball electrically connects to the interconnect.

3. A method of forming a package for an integrated circuit by electrically connecting a plurality of solder bumps with a plurality of solder balls, thereby providing a package for connecting varying integrated circuits to substrates such as a printed circuit board, the method comprising:

forming a plurality of first conductors within a plurality of first pockets on a first side of a substrate, wherein each of the first pockets is configured to at least partially accept a solder bump connected to an integrated circuit and wherein each first conductor includes a deflectable portion for creating a compliant connection between the integrated circuit and the first conductor;

forming a plurality of second conductors within a plurality of second pockets on a second side of the substrate, wherein each of the second pockets is configured to at least partially accept a solder ball; and forming an interconnect layer electrically connecting the first conductor with the second conductor, wherein the forming the plurality of first conductors further comprises forming the deflectable portion from a resilient material configured to spring toward a non-deflected position when a solder bump is activated.

4. The method of claim 3, wherein the solder balls comprise an array of solder balls.

5. The method of claim 3, wherein at least a portion of the plurality of first pockets overlaps at least a portion of the plurality of second pockets, thereby forming a via from the first side to the second side of the substrate.

6. The method of claim 3, wherein the substrate comprises a tape.

7. The method of claim 3, wherein forming the plurality of first conductors further comprises forming the deflectable portion into at least one cantilever.

8. The method of claim 3, wherein forming the plurality of first conductors further comprises forming the deflectable portion into a plurality of opposing cantilevers.

9. The method of claim 3, wherein forming the plurality of first conductors further comprises forming the deflectable portion into a plurality of flaps.

10. The method of claim 3, further comprising affixing the integrated circuit to the substrate with adhesive.

* * * * *